(12) United States Patent
Jo et al.

(10) Patent No.: US 8,710,535 B2
(45) Date of Patent: Apr. 29, 2014

(54) LIGHT EMITTING DEVICE AND LIGHT EMITTING DEVICE PACKAGE

(71) Applicant: LG Innotek Co. Ltd., Seoul (KR)

(72) Inventors: Kyoung Woo Jo, Seoul (KR); Sun Kyung Kim, Seoul (KR); Woon Kyung Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/862,267

(22) Filed: Apr. 12, 2013

(65) Prior Publication Data

US 2013/0228813 A1    Sep. 5, 2013

Related U.S. Application Data

(63) Continuation of application No. 13/324,785, filed on Dec. 13, 2011, now Pat. No. 8,421,110, which is a continuation of application No. 13/022,255, filed on Feb. 7, 2011, now abandoned.

(30) Foreign Application Priority Data

Feb. 12, 2010  (KR) ................ 10-2010-0013553

(51) Int. Cl.
H01L 33/58 (2010.01)
(52) U.S. Cl.
USPC .................................... 257/98; 257/E33.068
(58) Field of Classification Search
USPC .............................. 257/98, E33.067, E33.068
See application file for complete search history.

(56) References Cited

U.S. PATENT DOCUMENTS

| | | | |
|---|---|---|---|
| 5,813,753 A | 9/1998 | Vriens et al. | |
| 6,501,091 B1 | 12/2002 | Bawendi et al. | |
| 6,642,547 B2 | 11/2003 | Matsubara et al. | |
| 6,949,772 B2 | 9/2005 | Shimizu et al. | |
| 7,005,679 B2 | 2/2006 | Tarsa et al. | |
| 7,102,175 B2 | 9/2006 | Orita | |
| 7,161,188 B2 | 1/2007 | Orita | |
| 7,390,684 B2 | 6/2008 | Izuno et al. | |
| 7,439,552 B2 | 10/2008 | Takigawa et al. | |
| 7,652,295 B2 | 1/2010 | Cho et al. | |
| 7,763,903 B2 | 7/2010 | Orita | |
| 7,768,023 B2 | 8/2010 | Diana et al. | |
| 7,781,789 B2* | 8/2010 | DenBaars et al. | 257/98 |
| 7,795,055 B2 | 9/2010 | Lee et al. | |

(Continued)

FOREIGN PATENT DOCUMENTS

| | | |
|---|---|---|
| JP | 2002-299698 A | 10/2002 |
| JP | 2005-268323 A | 9/2005 |

(Continued)

*Primary Examiner* — David Vu
*Assistant Examiner* — Earl Taylor
(74) *Attorney, Agent, or Firm* — Birch, Stewart, Kolasch & Birch, LLP

(57) ABSTRACT

Disclosed are a light emitting device, a method of manufacturing the same and a light emitting device package. The light emitting device of the embodiment includes a light emitting structure including a first conductive semiconductor layer, a second conductive semiconductor layer and an active layer between the first and second conductive semiconductor layers; a fluorescent layer on the light emitting structure; and a light extracting structure on the fluorescent layer. The light extracting structure extracts light, which is generated in the light emitting structure and incident into an interfacial surface between the fluorescent layer and the light extracting structure, to an outside of the light emitting structure.

20 Claims, 8 Drawing Sheets

(56) References Cited

U.S. PATENT DOCUMENTS

| | | |
|---|---|---|
| 7,825,427 B2 | 11/2010 | Xu et al. |
| 7,868,340 B2 | 1/2011 | Xu et al. |
| 7,872,414 B2 | 1/2011 | Sugita et al. |
| 7,906,791 B2 | 3/2011 | Nakahara |
| 7,943,947 B2 | 5/2011 | Do |
| 8,421,110 B2 | 4/2013 | Jo et al. |
| 2003/0127660 A1 | 7/2003 | Bawendi et al. |
| 2004/0061433 A1 | 4/2004 | Izuno et al. |
| 2004/0145895 A1 | 7/2004 | Ouderkirk et al. |
| 2004/0206962 A1* | 10/2004 | Erchak et al. .................. 257/79 |
| 2004/0206969 A1 | 10/2004 | Orita |
| 2004/0233664 A1 | 11/2004 | Beeson et al. |
| 2005/0135079 A1 | 6/2005 | Chua et al. |
| 2005/0184638 A1 | 8/2005 | Mueller et al. |
| 2005/0215164 A1 | 9/2005 | Mueller et al. |
| 2005/0285132 A1 | 12/2005 | Orita |
| 2006/0060868 A1 | 3/2006 | Orita |
| 2006/0068154 A1 | 3/2006 | Parce et al. |
| 2006/0081862 A1 | 4/2006 | Chua et al. |
| 2006/0113895 A1 | 6/2006 | Baroky et al. |
| 2006/0164003 A1 | 7/2006 | Chan et al. |
| 2006/0261323 A1 | 11/2006 | Suh et al. |
| 2006/0267034 A1 | 11/2006 | Orita |
| 2007/0012928 A1 | 1/2007 | Peng et al. |
| 2007/0018186 A1 | 1/2007 | Shin et al. |
| 2007/0023763 A1* | 2/2007 | Takigawa et al. ............... 257/79 |
| 2007/0024175 A1 | 2/2007 | Chua |
| 2007/0085102 A1 | 4/2007 | Orita |
| 2007/0241661 A1 | 10/2007 | Yin |
| 2007/0257269 A1 | 11/2007 | Cho et al. |
| 2007/0263408 A1 | 11/2007 | Chua |
| 2008/0012031 A1 | 1/2008 | Jang et al. |
| 2008/0074032 A1 | 3/2008 | Yano et al. |
| 2008/0128731 A1* | 6/2008 | DenBaars et al. ............... 257/98 |
| 2008/0135856 A1 | 6/2008 | Moon |
| 2008/0237620 A1 | 10/2008 | Shiue et al. |
| 2008/0258160 A1* | 10/2008 | Do ................................ 257/98 |
| 2008/0303419 A1 | 12/2008 | Fukuda |
| 2009/0015142 A1 | 1/2009 | Potts et al. |
| 2009/0015757 A1 | 1/2009 | Potts et al. |
| 2009/0045422 A1 | 2/2009 | Kato et al. |
| 2009/0052159 A1 | 2/2009 | Abe et al. |
| 2009/0108279 A1 | 4/2009 | Kim |
| 2009/0137072 A1* | 5/2009 | Erchak et al. .................. 438/26 |
| 2009/0206355 A1* | 8/2009 | Erchak et al. .................. 257/98 |
| 2009/0230545 A1* | 9/2009 | Erchak et al. ................. 257/734 |
| 2009/0267048 A1 | 10/2009 | Nakahara |
| 2009/0267092 A1 | 10/2009 | Fukshima et al. |
| 2009/0286337 A1* | 11/2009 | Lee et al. ......................... 438/27 |
| 2009/0296369 A1 | 12/2009 | Xu et al. |
| 2010/0066236 A1 | 3/2010 | Xu et al. |
| 2010/0127635 A1 | 5/2010 | Yao |
| 2010/0142189 A1 | 6/2010 | Hong et al. |
| 2010/0244079 A1 | 9/2010 | Orita |
| 2010/0308339 A1 | 12/2010 | Hwang et al. |
| 2010/0327305 A1 | 12/2010 | Diana et al. |
| 2011/0001161 A1 | 1/2011 | Park et al. |
| 2011/0291134 A1 | 12/2011 | Kang |
| 2012/0086036 A1 | 4/2012 | Jo et al. |
| 2012/0170602 A1 | 7/2012 | Hikmet et al. |

FOREIGN PATENT DOCUMENTS

| | | |
|---|---|---|
| JP | 2006-24615 A | 1/2006 |
| JP | 2006-041479 A | 2/2006 |
| JP | 2007-214579 A | 8/2007 |
| JP | 2007-273975 A | 10/2007 |
| JP | 2008-084973 A | 4/2008 |
| JP | 2008-521211 A | 6/2008 |
| JP | 2008-270390 A | 11/2008 |
| JP | 2009-076911 A | 4/2009 |
| JP | 2011-26732 A | 2/2011 |
| JP | 2011-166148 A | 8/2011 |
| JP | 4903902 B2 | 3/2012 |
| JP | 2013-504890 A | 2/2013 |
| KR | 10-2008-0070414 A | 7/2008 |
| KR | 10-2008-083776 A | 9/2008 |
| KR | 10-2008-0083776 A | 9/2008 |
| KR | 10-2009-00215-A31 | 3/2009 |
| KR | 10-2009-0050592 A | 5/2009 |
| WO | WO 2005/104247 A1 | 11/2005 |
| WO | WO 2009/002040 A2 | 12/2009 |
| WO | WO 2010/011074 A2 | 1/2010 |
| WO | WO 2011/033394 A1 | 3/2011 |

* cited by examiner

LIGHT EMITTING DEVICE AND LIGHT
EMITTING DEVICE PACKAGE

CROSS-REFERENCE TO RELATED
APPLICATION

This application is a continuation of co-pending U.S. application Ser. No. 13/324,785 filed on Dec. 13, 2011, which is a continuation of U.S. application Ser. No. 13/022,255 filed on Feb. 7, 2011, which claims the benefit of Korean Patent Application No. 10-2010-0013553, filed Feb. 12, 2010. The entire contents of all of the above applications are hereby incorporated by reference.

BACKGROUND

The embodiment relates to a light emitting device, a method of manufacturing the same, and a light emitting device package.

A light emitting device (LED) includes a p-n junction diode having a characteristic of converting electric energy into light energy. The p-n junction diode can be formed by combining group III and V elements of the periodic table. The LED can represent various colors by adjusting the compositional ratio of compound semiconductors.

When forward voltage is applied to the LED, electrons of an n layer are bonded with holes of a p layer, so that energy corresponding to an energy gap between a conduction band and a valance band may be generated. This energy is mainly realized as heat or light, and the LED emits the energy as the light.

A nitride semiconductor represents superior thermal stability and wide bandgap energy, so the nitride semiconductor has been spotlighted in the field of optical devices and high-power electronic devices. In particular, blue, green, and UV light emitting devices employing the nitride semiconductor have already been developed and extensively used.

Meanwhile, in order to realize a white LED package, LEDs of red, green and blue colors, which are three primary colors of light, are combined with each other, the yellow phosphor (YAG or TAG) is added to the blue LED, or red/green/blue phosphors are employed in the UV LED.

However, in the white LED package using the phosphor according to the related art, the phosphor may not be uniformly distributed around an LED chip, resulting in the wide color temperature distribution.

In addition, according to the related art, the distribution area of the phosphor is relatively larger than the area of the LED, so that the phosphor may not be uniformly distributed around the LED, resulting in the wide color temperature distribution.

In addition, according to the related art, the light converted by the phosphor is total-reflected from a boundary surface of the background material and then introduced again into the LED chip, so that the efficiency of the white LED may be degraded.

BRIEF SUMMARY

The embodiment provides a light emitting device, a method of manufacturing the same, and a light emitting device package, capable of improving the extraction efficiency of light converted by a phosphor and reducing the variation in the color temperature according to the radiation angle.

A light emitting device according to the embodiment includes a light emitting structure including a first conductive semiconductor layer, a second conductive semiconductor layer and an active layer between the first and second conductive semiconductor layers; a fluorescent layer on the light emitting structure; and a light extracting structure on the fluorescent layer, wherein the light extracting structure extracts light, which is generated in the light emitting structure and incident into an interfacial surface between the fluorescent layer and the light extracting structure, to an outside of the light emitting structure.

A method of manufacturing the light emitting device according to the embodiment includes forming a light emitting structure including a first conductive semiconductor layer, an active layer and a second conductive semiconductor layer; forming a fluorescent layer on the light emitting structure; and forming a light extracting structure on the fluorescent layer.

A light emitting device package according to the embodiment includes a light emitting device having a fluorescent layer on a light emitting structure and a light extracting structure on the fluorescent layer wherein the light extracting structure extracts light, which is generated in the light emitting structure and incident into an interfacial surface between the fluorescent layer and the light extracting structure, to an outside of the light emitting structure; and a package body to install the light emitting device therein.

BRIEF DESCRIPTION OF THE DRAWINGS

FIGS. 4 to 7a are sectional views showing the procedure for manufacturing a light emitting device according to the embodiment;

DETAILED DESCRIPTION OF THE
EMBODIMENTS

Hereinafter, a light emitting device, a method of manufacturing the same and a light emitting device package according to the embodiments will be described in detail with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiments

Figure 1:
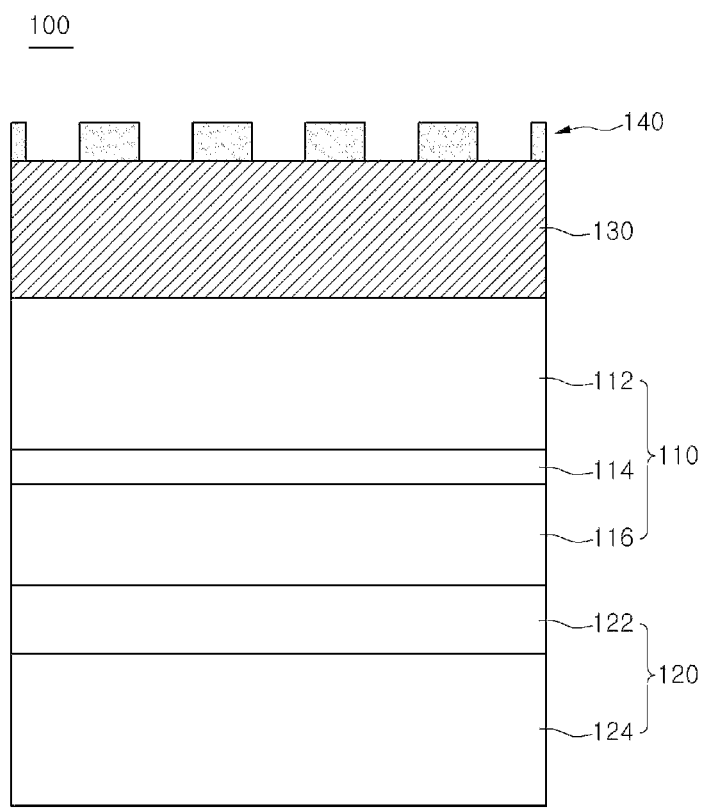
FIG. 1 is a sectional view showing a light emitting device according to the embodiment.

FIG. 1 is a sectional view showing a light emitting device 100 according to the embodiment.

The light emitting device 100 according to the embodiment includes a light emitting structure 110 having a first conductive semiconductor layer 112, an active layer 114 and a second conductive semiconductor layer 116, a fluorescent layer 130 formed on the light emitting structure 110, and a light extracting structure 140 formed on the fluorescent layer 130.

In detail, the light extracting structure 140 may include patterns. The patterns may be periodic patterns or non-periodic patterns. In addition, the patterns may have the same shape or different shapes, which are repeated periodically or non-periodically.

The patterns diffract, disperse or scatter the light incident into the interfacial surface between the fluorescent layer 130 and the light extracting structure 140, and may have various shapes without limitation.

The fluorescent layer 130 may have a uniform thickness.

The light extracting structure 140 may include a dielectric substance including at least one of oxide, nitride and chloride, but the embodiment is not limited thereto.

The light extracting structure 140 may include a material having a refractive index different from that of the fluorescent layer 130. For instance, the light extracting structure 140 may have the refractive index higher or lower than that of the fluorescent layer 130.

According to the embodiment, a background material (not shown) may be formed on the light extracting structure 140, in which the background material has a refractive index different from that of the light extracting structure 140.

The light extracting structure 140 may have periodicity in the range of 50 nm to 3000 nm, but the embodiment is not limited thereto.

According to the light emitting device of the embodiment, the light extraction efficiency in the phosphor can be improved due to the fluorescent layer 130 so that the efficiency of the white LED can be improved. In addition, since the emission distribution in the phosphor can be adjusted, the variation in color temperature according to the radiation angle of the white LED can be reduced. Hereinafter, the light emitting device 100 according to the embodiment will be described.

The white LED can be realized in the form of a combination of a blue LED and a phosphor. One of important factors in the white LED is to reduce the variation in the color temperature according to the radiation angle. In this regard, the fluorescent layer having the uniform thickness is formed on a top of a chip through a conformal coating process. That is, the phosphor is prepared as a light source having the position and area identical to those of the blue LED, thereby reducing the variation of the color temperature in the package according to the light route except for the chromatic aberration.

The travelling route of the light having the long wavelength, which is converted by the phosphor, is substantially identical to the travelling route of the blue light, which is not absorbed in the phosphor, so the variation in the color temperature according to the travelling route of the light can be disregarded.

Figure 2:
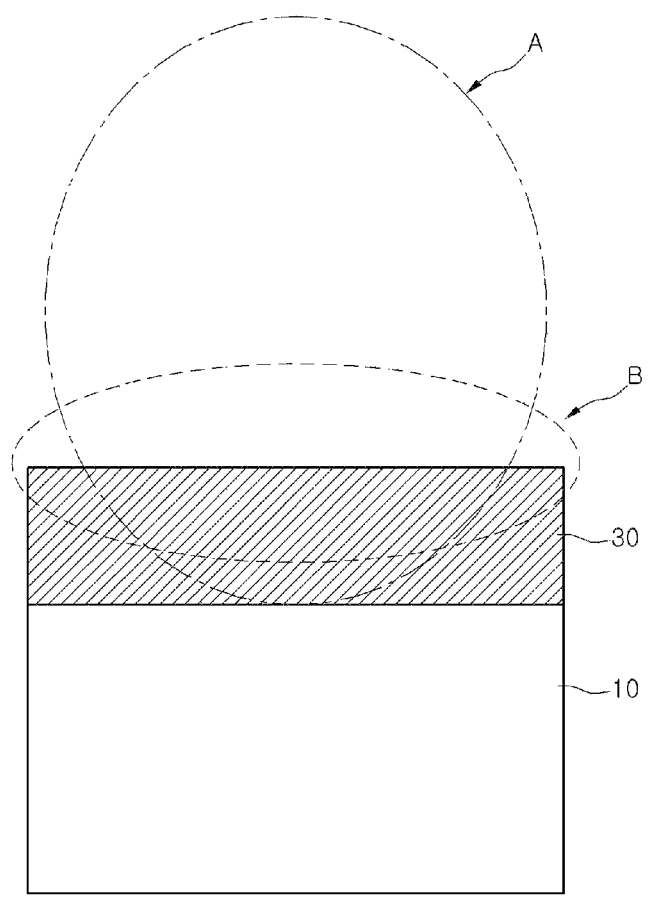
FIG. 2 is a view showing a light emitting pattern of a light emitting device according to the related art.

FIG. 2 is a sectional view showing the light emitting pattern of a light emitting device according to the related art.

As shown in FIG. 2, the color temperature variation may occur according to the radiation angle even if the fluorescent layer having the uniform thickness is coated through the conformal coating process.

This is because the distribution A of the blue light emitted from the light emitting structure 10 is different from the distribution B of the light converted by the phosphor 30.

That is, the distribution A of the blue light is determined depending on the interfacial surface between GaN and the background material (air or Si gel) and the light extracting structure. In detail, the blue light is more concentrated in the vertical direction.

In contrast, since the light having the long wavelength, which is converted by the phosphor, is emitted through the spontaneous emission, the light can be distributed in the lateral direction with the same probability. Thus, if the white LED is realized by combining these two lights, the light intensity may be increased in the vertical direction, that is, the relatively higher color temperature is obtained as the radiation angle is directed in the vertical direction.

In particular, since the vertical type GaN LED has the emission distribution concentrated in the vertical direction more than the lateral type GaN LED, it is necessary to design and develop a chip having the emission distribution similar to that of the light converted by the phosphor.

In addition, according to the related art, the light converted by the phosphor is total-reflected from a boundary surface of the background material and then introduced again into the GaN LED, so that the efficiency of the white LED may be degraded.

Figure 3:
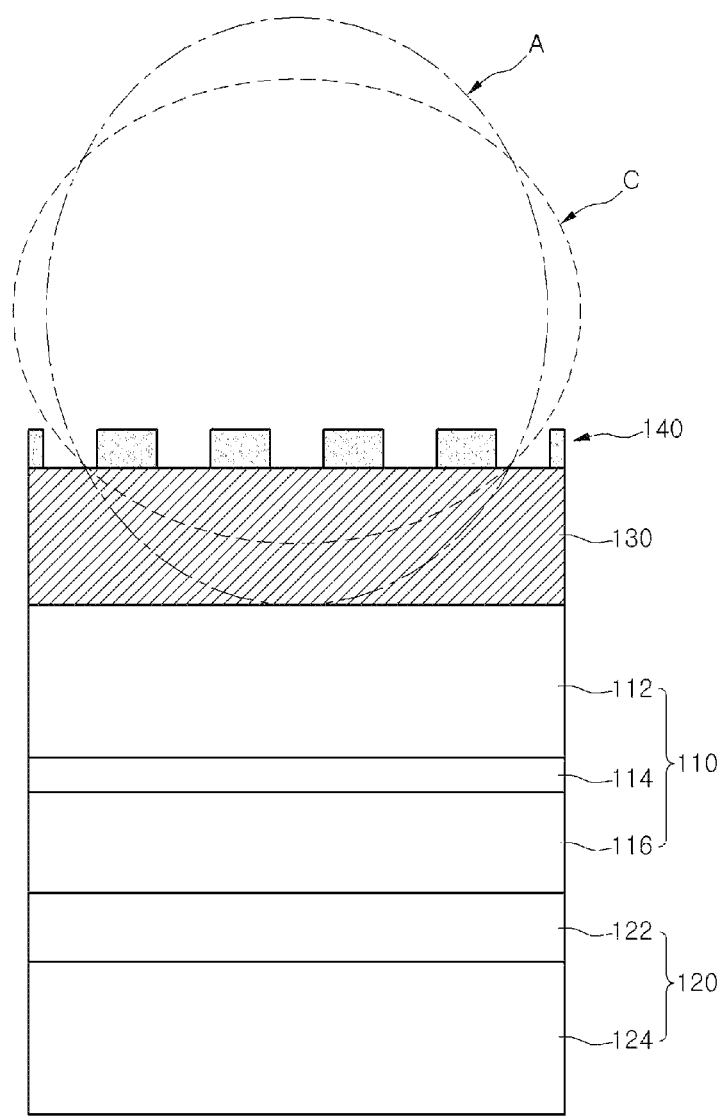
FIG. 3 is a view showing a light emitting pattern of a light emitting device according to the embodiment.

FIG. 3 is a sectional view showing a light emitting pattern of a light emitting device according to the embodiment.

The light emitting device according to the embodiment may include a light emitting structure 110, and a fluorescent layer 130 formed on the light emitting structure. In addition, a background material (not shown) having the uniform thickness and a light extracting structure 140 having a refractive index different from that of the fluorescent layer 130 may be formed on the fluorescent layer 130. The light extracting structure 140 may include a material selected from oxide, nitride or chloride, such as $SiO_2$, $Si_3N_4$, or $TiO_2$. In addition, the refractive index, the pattern period and the pattern height of the material for maximizing the extraction efficiency can be determined depending on the type of the background material (air or Si gel).

Due to the light extracting structure 140 having the above structure, the emission distribution in the fluorescent layer 130 may be directed in the vertical direction C rather than the lateral direction while representing the light extraction efficiency the same as that of the square lattice pattern having periodicity according to the related art.

The light can be concentrated in the vertical direction by the light extracting structure 140 because the light diffraction occurs due to the periodicity of the pattern lattice. If the fluorescent layer having the uniform thickness is formed on the vertical type chip having the patterns, the variation in the color temperature can be reduced.

According to the light emitting device of the embodiment, the light extraction efficiency in the phosphor can be improved due to the fluorescent layer including the patterns, so that the efficiency of the white LED can be improved. In addition, the variation in the color temperature according to the radiation angle of the white LED can be reduced by adjusting the emission distribution in the phosphor.

Hereinafter, the method for manufacturing the light emitting device according to the embodiment will be described with reference to FIGS. 4 to 7a.

Figure 4:
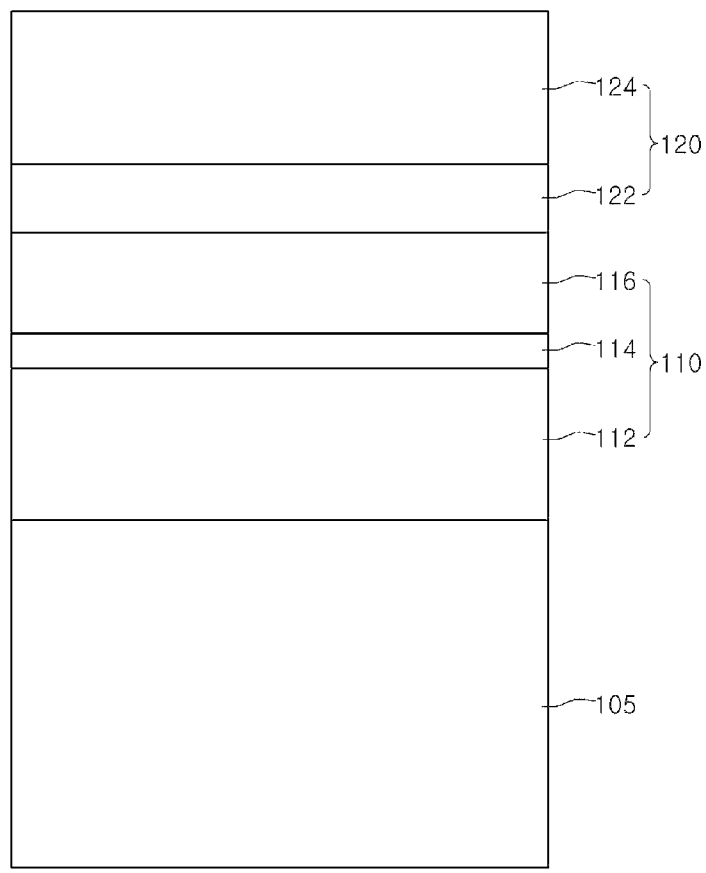

First, a first substrate 105 is prepared as shown in FIG. 4. The first substrate 105 may include a conductive substrate or an insulating substrate. For instance, the first substrate 105 may include at least one of $Al_2O_3$, SiC, Si, GaAs, GaN, ZnO, Si, GaP, InP, Ge, and $Ga_2O_3$. A concave-convex structure can be formed on the first substrate 105, but the embodiment is not limited thereto.

The first substrate 105 can be subject to the wet cleaning to remove impurities from the surface of the first substrate 105.

Then, the light emitting structure 110 including the first conductive semiconductor layer 112, the active layer 114 and the second semiconductor layer 116 is formed on the first substrate 105.

A buffer layer (not shown) can be formed on the first substrate 105. The buffer layer may attenuate lattice mismatch between the light emitting structure 110 and the first substrate 105. The buffer layer may include the group III-V compound semiconductor. For instance, the buffer layer may include at least one of GaN, InN, MN, InGaN, AlGaN, InAlGaN, and AlInN. An undoped semiconductor layer can be formed on the buffer layer, but the embodiment is not limited thereto.

The first conductive semiconductor layer 112 may include a group III-V compound semiconductor doped with a first conductive dopant. If the first conductive semiconductor layer 112 is an N type semiconductor layer, the first conductive dopant is an N type dopant, such as Si, Ge, Sn, Se, or Te, but the embodiment is not limited thereto.

The first conductive semiconductor layer 112 may include semiconductor material having the compositional formula of $In_xAl_yGa_{1-x-y}N$ ($0 \le x \le 1$, $0 \le y \le 1$, $0 \le x+y \le 1$).

In addition, the first conductive semiconductor layer 112 may include at least one of GaN, InN, MN, InGaN, AlGaN, InAlGaN, AlInN, AlGaAs, InGaAs, AlInGaAs, GaP, AlGaP, InGaP, AlInGaP, and InP.

The first conductive semiconductor layer 102 may include an N type GaN layer, which is formed through the CVD (Chemical Vapor Deposition), MBE (Molecular Beam Epitaxy), sputtering or HVPE (Hydride Vapor Phase Epitaxy).

In addition, the first conductive semiconductor layer 112 can be formed by injecting trimethyl gallium (TMGa) gas, ammonia (NH3) gas, nitrogen (N2) gas and silane (SiH4) gas including n type impurities, such as silicon, into the chamber.

Electrons injected through the first conductive semiconductor layer 112 meet holes injected through the second conductive semiconductor layer 116 at the active layer 114, so that the active layer 114 can emit the light having energy determined based on the intrinsic energy band of the active layer (light emitting layer) 114.

The active layer 114 may include at least one of a single quantum well structure, a multiple quantum well (MQW) structure, a quantum wire structure and a quantum dot structure. For instance, the active layer 114 can be formed with the MQW structure by injecting TMGa gas, NH3 gas, N2 gas, and trimethyl indium (TMIn) gas, but the embodiment is not limited thereto.

The active layer 114 may have a well/barrier layer including at least one of InGaN/GaN, InGaN/InGaN, GaN/AlGaN, InAlGaN/GaN, GaAs(InGaAs)/AlGaAs and GaP(InGaP)/AlGaP, but the embodiment is not limited thereto. The well layer may include material having the bandgap energy lower than that of the barrier layer.

A conductive clad layer (not shown) can be formed on and/or under the active layer 114. The conductive clad layer may include an AlGaN-based semiconductor having the bandgap energy higher than that of the active layer 114.

The second conductive semiconductor layer 116 may include the group IIIV compound semiconductor doped with the second conductive dopant. For instance, the second conductive semiconductor layer 116 may include the semiconductor material having the compositional formula of $In_xAl_yGa_{1-x-y}N$ ($0 \le x \le 1$, $0 \le y \le 1$, $0 \le x+y \le 1$). In detail, the second conductive semiconductor layer 116 may include one selected from the group consisting of GaN, MN, AlGaN, InGaN, InN, InAlGaN, AlInN, AlGaAs, GaP, GaAs, GaAsP, and AlGaInP. If the second conductive semiconductor layer 116 is a P type semiconductor layer, the second conductive dopant includes the P type dopant such as Mg, Zn, Ca, Sr, or Ba. The second conductive semiconductor layer 116 can be prepared as a single layer or a multiple layer, but the embodiment is not limited thereto.

The second conductive semiconductor layer 116 may include a p type GaN layer, which can be formed by injecting TMGa gas, NH3 gas, N2 gas and (EtCp2Mg){Mg(C2H5C5H4)2} gas including p type impurities (for example, Mg) into the chamber, but the embodiment is not limited thereto.

According to the embodiment, the first conductive semiconductor layer 112 may include an N type semiconductor layer and the second conductive semiconductor layer 106 may include a P type semiconductor layer, but the embodiment is not limited thereto. In addition, a semiconductor layer, such as an N type semiconductor layer (not shown) having polarity opposite to that of the second conductive semiconductor layer 116, can be formed on the second conductive semiconductor layer 116. Thus, the light emitting structure 110 may include one of an N-P junction structure, a P-N junction structure, an N-P-N junction structure, and a P-N-P junction structure.

After that, the second electrode layer 120 is formed on the second conductive semiconductor layer 116.

The second electrode layer 120 may include an ohmic layer, a reflective layer 122, an adhesive layer (not shown) and a support substrate 124.

For instance, the second electrode layer 120 may include the ohmic layer that comes into ohmic contact with the light emitting structure 110 to easily supply power to the light emitting structure 110. The ohmic layer can be prepared as a multiple layer by stacking a metal, a metal alloy, and metal oxide.

For instance, the ohmic layer may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO(indium gallium tin oxide), AZO (aluminum zinc oxide), ATO (antimony tin oxide), GZO(gallium zinc oxide), IZON (IZO nitride), AGZO (Al—Ga ZnO), IGZO (In—Ga ZnO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but the embodiment is not limited thereto.

In addition, the second electrode layer 120 may include the reflective layer 122 to reflect the light incident from the light emitting structure 110, thereby improving the light extraction efficiency.

For instance, the reflective layer 122 may include a metal or a metal alloy including at least one selected from the group consisting of Ag, Ni, Al, Rh, Pd, Ir, Ru, Mg, Zn, Pt, Au, and Hf. In addition, the reflective layer 122 can be prepared as a multiple layer by using the above metal or metal alloy and transmissive conductive material, such as IZO, IZTO, IAZO, IGZO, IGTO, AZO, or ATO. For instance, the reflective layer 122 may have the stack structure including IZO/Ni, AZO/Ag, IZO/Ag/Ni, or AZO/Ag/Ni.

In addition, if the second electrode layer 120 includes the adhesive layer, the reflective layer 122 may serve as a bonding layer or may include barrier metal or bonding metal. For instance, the adhesive layer may include at least one selected from the group consisting of Ti, Au, Sn, Ni, Cr, Ga, In, Bi, Cu, Ag and Ta.

The second electrode 120 includes the support substrate 124. The support substrate 124 supports the light emitting structure 110 to supply power to the light emitting structure 110. The support substrate 124 may include a metal having superior electric conductivity, a metal alloy or a conductive semiconductor material.

For instance, the support substrate 124 may include at least one selected from the group consisting of Cu, a Cu alloy, Au, Ni, Mo, Cu—W, and a carrier wafer, such as Si, Ge, GaAs, GaN, ZnO, SiGe, and SiC.

The support substrate 124 may have a thickness of about 30 μm to 500 μm which may vary depending on the design rule of the light emitting device.

The support substrate 124 can be formed through the electrochemical metal deposition scheme, the plating scheme or the bonding scheme using eutectic metal.

Figure 5:
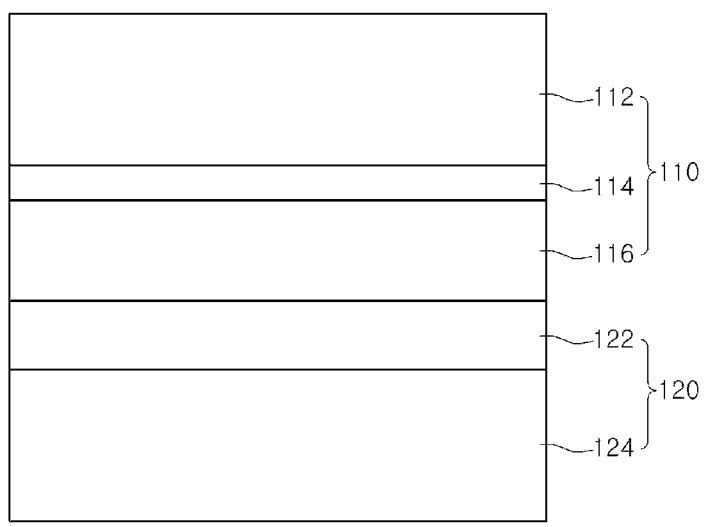

Then, as shown in FIG. 5, the first substrate 105 is removed such that the first conductive semiconductor layer 112 can be exposed. The first substrate 105 can be removed through the laser lift off scheme or the chemical lift off scheme. In addition, the first substrate 105 can be removed by physically grinding the first substrate 105.

According to the laser lift off scheme, predetermined energy supplied in the normal temperature is absorbed in the interfacial surface between the first substrate 105 and the light emitting structure, so that the bonded surface of the light emitting structure is thermally decomposed, thereby separating the substrate 105 from the light emitting structure.

Figure 6:
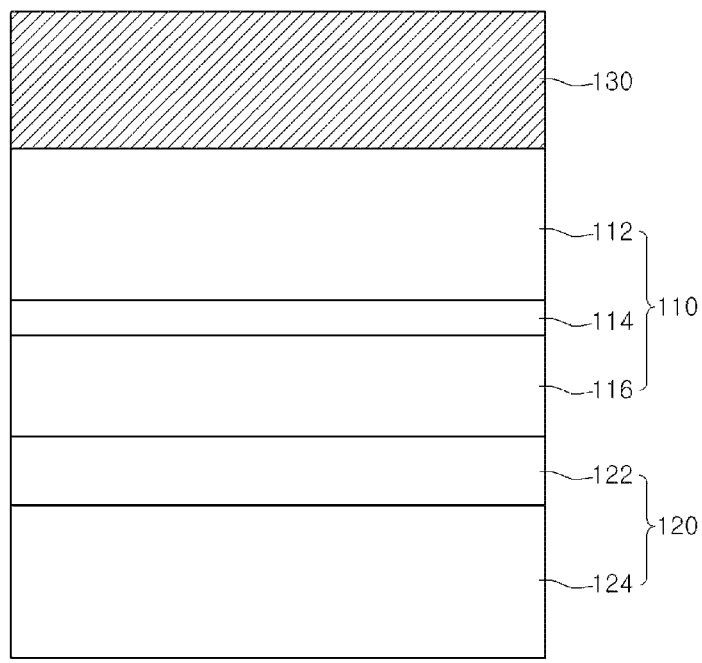

Then, as shown in FIG. 6, the fluorescent layer 130 is formed on the light emitting structure 110. The fluorescent layer 130 has a uniform thickness.

The fluorescent layer 130 can be formed by adding the yellow phosphor (YAG or TAG) to the blue LED, or by combining red/green/blue phosphors with the UV LED, but the embodiment is not limited thereto.

The phosphor may include a host material and an active material. For instance, a cesium (Cs) active material can be added to a YAG (yttrium aluminum garnet) host material, or a europium (Er) active material can be added to a silicate-based host material, but the embodiment is not limited thereto.

The top surface of the fluorescent layer 130 may be planarized through the conformal coating process, but the embodiment is not limited thereto. The fluorescent layer 130 may have the uniform thickness. Since the fluorescent layer 130 having the planar top surface is uniformly formed on the light emitting structure 110, the phosphors can be uniformly distributed around the chip of the light emitting device and surface light emission is possible so that the optical design can be facilitated.

Figure 7A:
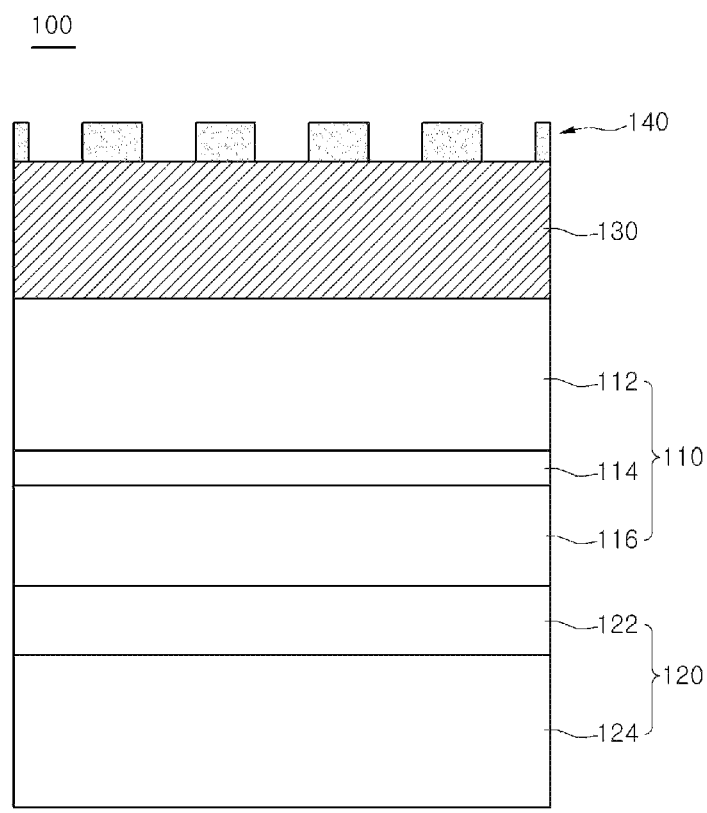

Then, the light extracting structure 140 is formed on the fluorescent layer 130 as shown in FIG. 7a.

The light extracting structure 140 may include a dielectric substance including at least one of oxide, nitride and chloride, such as SiO2, Si3N4, and TiO2, but the embodiment is not limited thereto.

For instance, the light extracting structure 140 can be formed by forming a dielectric layer (not shown) on the fluorescent layer 130 and then patterning the dielectric layer.

Besides the patterns formed by patterning the dielectric layer using a mask, the light extracting structure 140 may include a plurality of protrusions for improving the light extraction efficiency. For instance, the light extracting structure 140 may include a roughness formed by wet-etching the dielectric layer.

The light extracting structure 140 can be formed by using a material having the refractive index different from that of the fluorescent layer 130. For instance, the light extracting structure 140 may have the refractive index higher or lower than that of the fluorescent layer 130.

The light extracting structure 140 may have periodicity in the range of 50 nm to 3000 nm, but the embodiment is not limited thereto.

According to the embodiment, a background material (air or Si gel) may be additionally formed on the light extracting structure 140, in which the background material may have the refractive index different from that of the light extracting structure 140.

Since the light extracting structure 140 has the periodicity, the light extraction efficiency can be improved, so that the emission distribution in the fluorescent layer 130 may be directed in the vertical direction rather than the lateral direction, thereby reducing the variation in the color temperature.

Figure 7B:
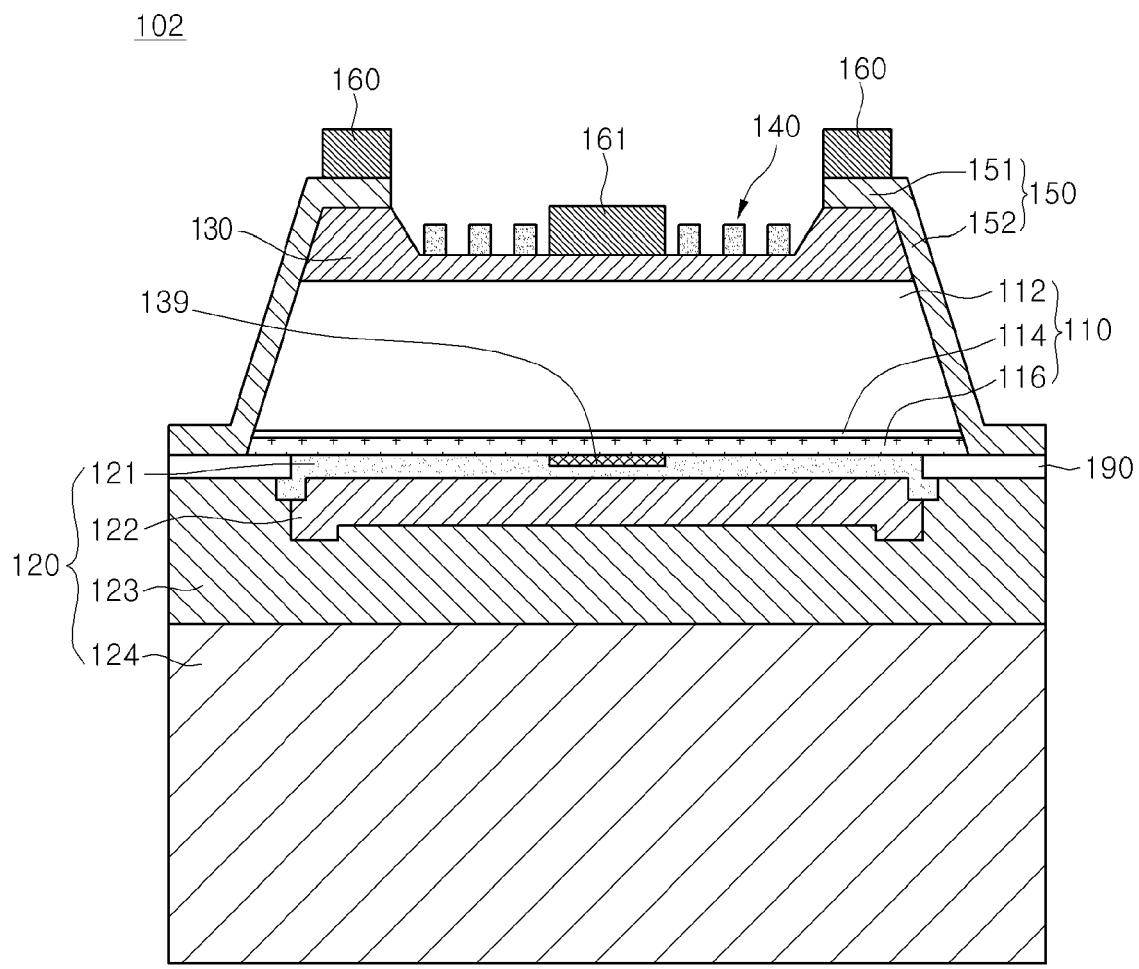
FIG. 7b is a sectional view showing a light emitting device according to another embodiment.

According to the light emitting device and the method of manufacturing the same of the embodiment, the light extraction efficiency in the phosphor can be improved due to the fluorescent layer including the patterns, so that the efficiency of the white LED can be improved. In addition, the variation in the color temperature according to the radiation angle of the white LED can be reduced by adjusting the emission distribution in the phosphor. FIG. 7b is a cross-sectional view illustrating a light emitting device according to another embodiment.

A light emitting device 102 according to the other embodiment may include a light emitting structure 110 including a first conductive semiconductor layer 112, an active layer 114, and a second conductive semiconductor layer 116, a first dielectric layer 151 formed on a part of an upper surface of the light emitting structure 110, and a pad electrode 160 formed on the first dielectric layer 151.

In the embodiment, a dielectric layer 150 may include the first dielectric layer 151 and a second dielectric layer 152 formed on a side of the light emitting structure 110. Herein, the first dielectric layer 151 and the second dielectric layer 152 may be connected to each other.

In the embodiment, a first electrode 161 may be included on the light emitting structure 110. The pad electrode 160 may be electrically connected to the first electrode 161.

The light extracting structure 140 may be formed at the upper surface of the light emitting structure 110 to improving the light extraction efficiency.

A second electrode layer 120 is formed under the light emitting structure 110. The second electrode layer 120 may include an ohmic layer 121, a reflection layer 122, a junction layer 123, and a support substrate 124.

A protection member 190 may be formed obliquely below the light emitting structure 110. A Current Blocking Layer (CBL) 139 may be formed between the light emitting structure 110 and the ohmic layer 121.

The protection member 190 may be formed circumferentially between the light emitting structure 110 and the junction layer 123. Accordingly, the protection member 190 may be formed as a ring shape, a loop shape, or a square shape. A part of the protection member 190 may be overlapped with the light emitting structure 110 in a vertical direction.

The protection member 190 may reduce a possibility of a short circuit between the junction layer 123 and the active layer 114 by increasing a distance between each side of the junction layer 123 and the active layer 114.

The protection member 190 may also prevent occurrence of the short circuit during a chip separation process.

The protection member 190 may be formed with electric insulative material, material having lower electric conductivity than the reflection layer 122 or the junction layer 123, or material forming a Schottky connection with the second conductive semiconductor layer 116. For instance, the protection member 190 may include at least one of ITO, IZO, IZTO, IAZO, IGZO, IGTO, AZO, ATO, ZnO, SiO2, SiOx, SiOxNy, Si3N4, Al2O3, TiOx, TiO2, Ti, Al or Cr.

Figure 8:
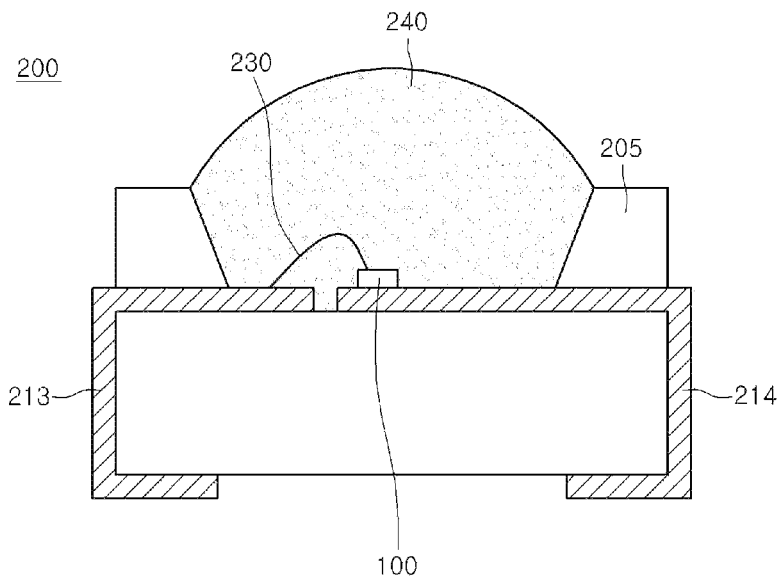
FIG. 8 is a sectional view showing a light emitting device package according to the embodiment.

FIG. 8 is a view showing a light emitting device package 200 including the light emitting device according to the embodiments.

The light emitting device package 200 according to the embodiment includes a package body 205, third and fourth electrode layers 213 and 214 formed on the package body 205, the light emitting device 100 provided on the package body 205 and electrically connected to the third and fourth 213 and 214 and a molding member 240 that surrounds the light emitting device 100.

The package body 205 may include silicon, synthetic resin or metallic material. An inclined surface may be formed around the light emitting device 100.

The third and fourth electrode layers 213 and 214 are electrically isolated from each other to supply power to the light emitting device 100. In addition, the third and fourth electrode layers 213 and 214 reflect the light emitted from the light emitting device 100 to improve the light efficiency and dissipate heat generated from the light emitting device 100 to the outside.

The vertical type light emitting device shown in FIG. 1 can be employed as the light emitting device 100, but the embodiment is not limited thereto. For instance, the lateral type light emitting device can be used as the light emitting device 100.

The light emitting device 100 can be installed on the package body 205 or the third and fourth electrode layers 213 and 214.

The light emitting device 100 is electrically connected to the third electrode layer 213 and/or the fourth electrode layer 214 through at least one of a wire bonding scheme, a flip chip bonding scheme and a die bonding scheme. According to the embodiment, the light emitting device 100 is electrically connected to the third electrode layer 213 through a wire 230 and electrically connected to the fourth electrode layer 214 through the die bonding scheme.

The molding member 240 surrounds the light emitting device 100 to protect the light emitting device 100. In addition, the molding member 240 may include phosphors to change the wavelength of the light emitted from the light emitting device 100.

A plurality of light emitting device packages according to the embodiment may be arrayed on a substrate, and an optical member including a light guide plate, a prism sheet, a diffusion sheet or a fluorescent sheet may be provided on the optical path of the light emitted from the light emitting device package. The light emitting device package, the substrate, and the optical member may serve as a backlight unit or a lighting unit. For instance, the lighting system may include a backlight unit, a lighting unit, an indicator, a lamp or a streetlamp.

Figure 9:
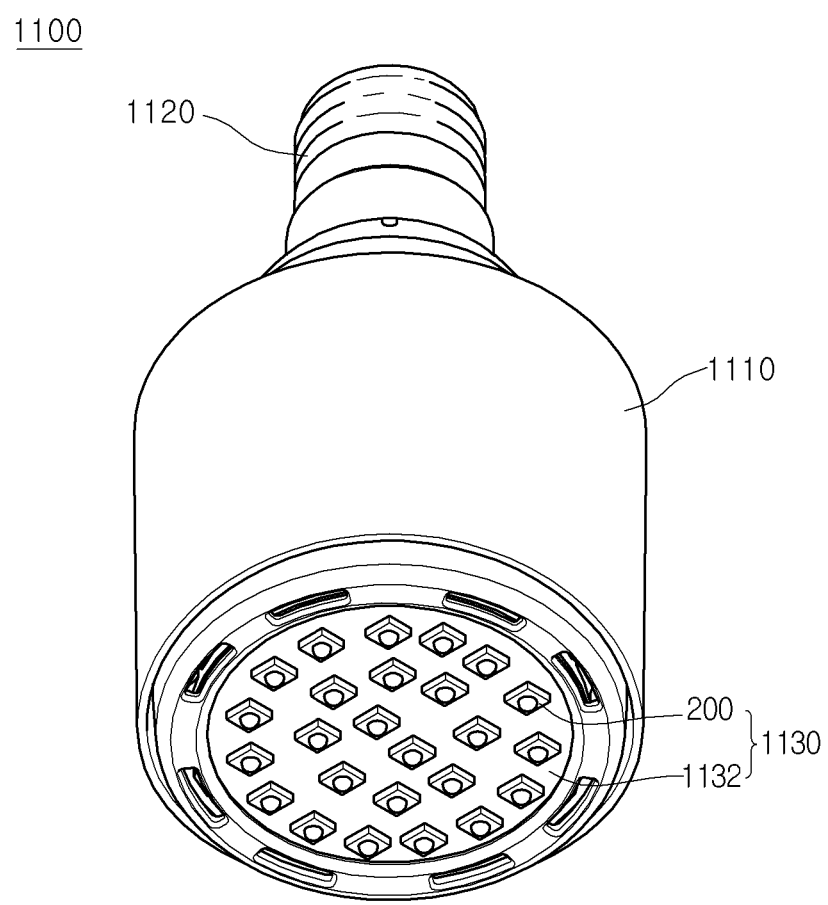
FIG. 9 is a perspective view showing a lighting unit according to the embodiment.

FIG. 9 is a perspective view showing a lighting unit 1100 according to the embodiment. The lighting unit 1100 shown in FIG. 9 is an example of a lighting system and the embodiment is not limited thereto.

Referring to FIG. 9, the lighting unit 1100 includes a case body 1110, a light emitting module 1130 installed in the case body 1110, and a connection terminal 1120 installed in the case body 1110 to receive power from an external power source.

Preferably, the case body 1110 includes material having superior heat dissipation property. For instance, the case body 1110 includes metallic material or resin material.

The light emitting module 1130 may include a substrate 1132 and at least one light emitting device package 200 installed on the substrate 1132.

The substrate 1123 includes an insulating member printed with a circuit pattern. For instance, the substrate 1132 includes a PCB (printed circuit board), an MC (metal core) PCB, an F (flexible) PCB, or a ceramic PCB.

In addition, the substrate 1132 may include material that effectively reflects the light. The surface of the substrate 1132 can be coated with a color, such as a white color or a silver color, to effectively reflect the light.

At least one light emitting device package 200 can be installed on the substrate 1132. Each light emitting device package 200 may include at least one light emitting device 100. The light emitting device 100 may include a colored LED that emits the light having the color of red, green, blue or white and a UV (ultraviolet) LED that emits UV light.

The light emitting device packages 200 of the light emitting module 1130 can be variously arranged to provide various colors and brightness. For instance, the white LED, the red LED and the green LED can be arranged to achieve the high color rendering index (CRI).

The connection terminal 1120 is electrically connected to the light emitting module 1130 to supply power to the light emitting module 1130. The connection terminal 1120 has a shape of a socket screw-coupled with the external power source, but the embodiment is not limited thereto. For instance, the connection terminal 1120 can be prepared in the form of a pin inserted into the external power source or connected to the external power source through a wire.

Figure 10:
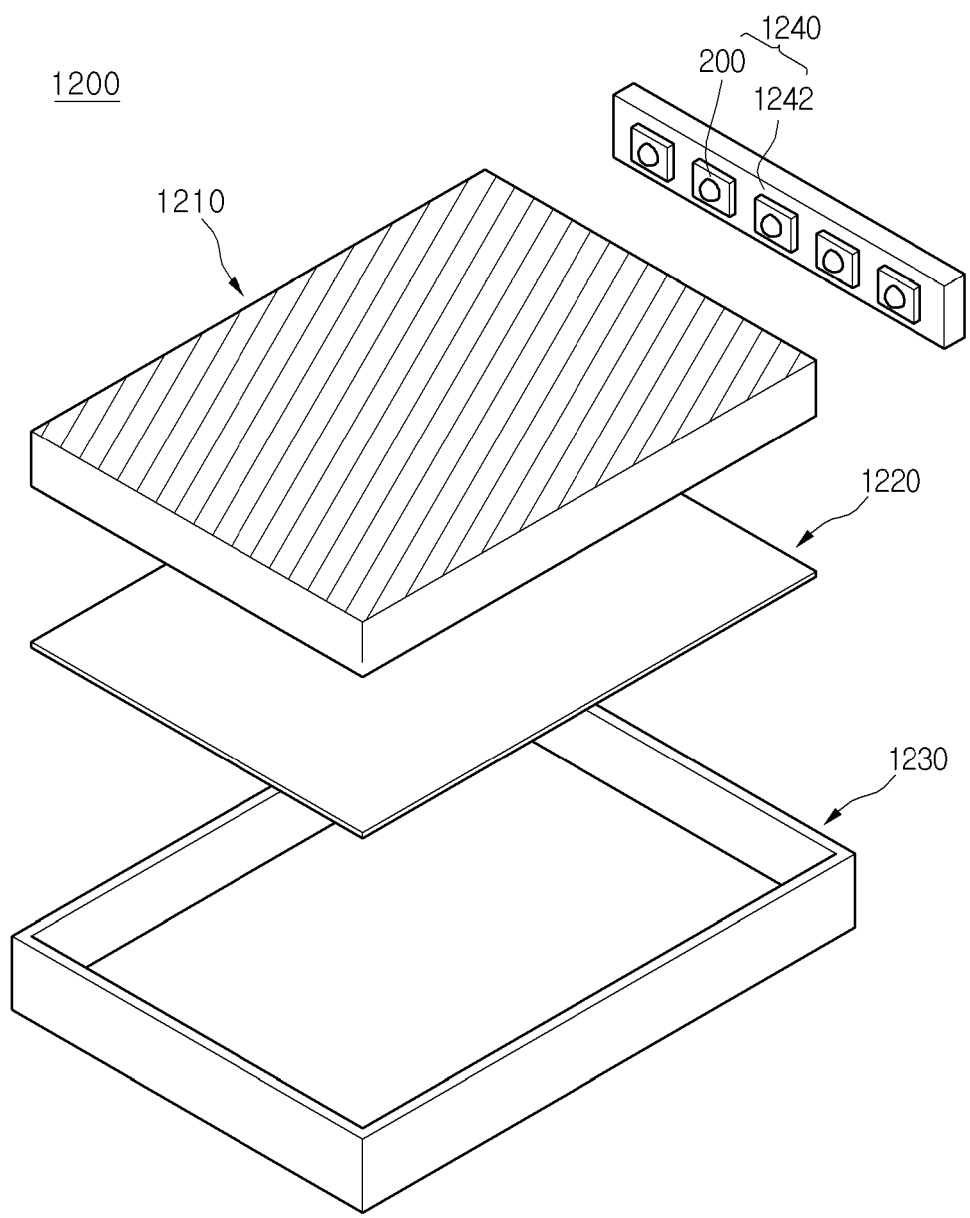
FIG. 10 is an exploded perspective view showing a backlight unit according to the embodiment.

FIG. 10 is an exploded perspective view showing a backlight unit 1200 according to the embodiment. The backlight unit 1200 shown in FIG. 10 is an example of a lighting system and the embodiment is not limited thereto.

The backlight unit 1200 according to the embodiment includes a light guide plate 1210, a light emitting module 1240 for providing the light to the light guide plate 1210, a reflective member 1220 positioned below the light guide plate, and a bottom cover 1230 for receiving the light guide plate 1210, light emitting module 1240, and the reflective member 1220 therein, but the embodiment is not limited thereto.

The light guide plate 1210 diffuses the light to provide surface light. The light guide 1210 includes transparent material. For instance, the light guide plate 1210 can be manufactured by using acryl-based resin, such as PMMA (polymethyl methacrylate), PET(polyethylene terephthalate), PC (polycarbonate), COC or PEN (polyethylene naphthalate) resin.

The light emitting module 1240 supplies the light to the lateral side of the light guide plate 1210 and serves as the light source of the display device including the backlight unit.

The light emitting module 1240 can be positioned adjacent to the light guide plate 1210, but the embodiment is not limited thereto. In detail, the light emitting module 1240 includes a substrate 1242 and a plurality of light emitting device packages 200 installed on the substrate 1242 and the substrate 1242 can be adjacent to the light guide plate 1210, but the embodiment is not limited thereto.

The substrate 1242 may include a printed circuit board (PCB) having a circuit pattern (not shown). In addition, the substrate 1242 may also include a metal core PCB (MCPCB) or a flexible PCB (FPCB), but the embodiment is not limited thereto.

In addition, the light emitting device packages 200 are arranged such that light exit surfaces of the light emitting device packages 200 are spaced apart from the light guide plate 1210 by a predetermined distance.

The reflective member 1220 is disposed below the light guide plate 1210. The reflective member 1220 reflects the light, which is travelled downward through the bottom surface of the light guide plate 1210, toward the light guide plate 1210, thereby improving the brightness of the backlight unit. For instance, the reflective member 1220 may include PET, PC or PVC resin, but the embodiment is not limited thereto.

The bottom cover 1230 may receive the light guide plate 1210, the light emitting module 1240, and the reflective member 1220 therein. To this end, the bottom cover 1230 has a box shape with an open top surface, but the embodiment is not limited thereto.

The bottom cover 1230 can be manufactured through a press process or an extrusion process by using metallic material or resin material.

As described above, the lighting system according to the embodiment includes the light emitting device package, so that the reliability of the lighting system can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting device comprising:
    a light emitting structure including a first conductive semiconductor layer, a second conductive semiconductor layer and an active layer between the first conductive semiconductor layer and the second conductive semiconductor layer;
    a fluorescent layer on the light emitting structure;
    a light extracting pattern on the fluorescent layer;
    wherein the light extracting pattern is on a top surface of the fluorescent layer,
    wherein the light extracting pattern partially exposes the top surface of the fluorescent layer, and
    wherein at least one portion of the top surface of the fluorescent layer is higher than a top most surface of the light extracting pattern.

2. The light emitting device as claimed in claim 1, wherein the light extracting pattern diffracts light which is emitted through a spontaneous emission converted by the fluorescent layer incident into an interfacial surface between the fluorescent layer and the light extracting pattern.

3. The light emitting device as claimed in claim 2, wherein an emission distribution of light in the fluorescent layer is directed in a vertical direction rather than a lateral direction during the light is diffracted and extracted by the light extracting pattern.

4. The light emitting device as claimed in claim 1, wherein the light extracting pattern comprises at least one convex portion and at least one concave portion, and the top surface of the fluorescent layer is exposed through the at least one concave portion.

5. The light emitting device as claimed in claim 1, wherein the light extracting pattern comprises a periodic pattern, wherein the periodic pattern has a period of 50nm to 3000nm.

6. The light emitting device as claimed in claim 1, wherein the light extracting pattern comprises a non-periodic pattern.

7. The light emitting device as claimed in claim 1, wherein the fluorescent layer has a uniform thickness.

8. The light emitting device as claimed in claim 1, wherein the light extracting pattern comprises a material having a refractive index different from that of the fluorescent layer.

9. A light emitting device comprising:
    a light emitting structure including a first conductive semiconductor layer, a second conductive semiconductor layer and an active layer between the first conductive semiconductor layer and the second conductive semiconductor layer;
    a fluorescent layer on the light emitting structure;
    a light extracting pattern on the fluorescent layer;
    a second electrode layer under the light emitting structure;
    a current blocking layer between the light emitting structure and the second electrode layer; and
    a protection member below the light emitting structure,
    wherein the second electrode layer includes at least one of an ohmic layer, a reflection layer, a junction layer, or a support substrate, and
    wherein the protection member is formed circumferentially between the light emitting structure and the second electrode layer.

10. The light emitting device as claimed in claim 9, wherein at least a part of the protection member is overlapped with the light emitting structure in a vertical direction.

11. The light emitting device as claimed in claim 9, wherein the protection member comprises at least one of an electric insulative material, a material having lower electric conductivity than the reflection layer or the junction layer, or a material forming a Schottky connection with the second conductive semiconductor layer.

12. The light emitting device as claimed in claim 9, wherein the light extracting pattern is directly disposed on a top surface of the fluorescent layer, and
    the light extracting pattern partially exposes the top surface of the fluorescent layer.

13. The light emitting device as claimed in claim 9, wherein the light extracting pattern diffracts light incident into an interfacial surface between the fluorescent layer and the light extracting pattern.

14. The light emitting device as claimed in claim 9, wherein the light extracting pattern comprises at least one convex portion and at least one concave portion, and the top surface of the fluorescent layer is exposed through the at least one concave portion.

15. The light emitting device as claimed in claim 9, wherein the light extracting pattern comprises a periodic or non-periodic pattern.

16. The light emitting device as claimed in claim 1, further comprising a first electrode on the light emitting structure, and a current blocking layer between the light emitting structure and the second electrode layer,
    wherein the first electrode is not vertically overlapped with the current blocking layer.

17. The light emitting device as claimed in claim 1, wherein the top most surface of the fluorescent layer is higher than the top most surface of the light extracting pattern.

18. The light emitting device as claimed in claim 9, wherein a top surface of the fluorescent layer is higher than a top most surface of the light extracting pattern.

19. The light emitting device as claimed in claim 10, wherein a top most surface of the fluorescent layer is higher than the top most surface of the light extracting pattern.

20. The light emitting device as claimed in claim 9, further comprising a first electrode on the light emitting structure, wherein the first electrode is not vertically overlapped with the current blocking layer.

* * * * *